(12) United States Patent
Chang et al.

(10) Patent No.: US 12,199,154 B2
(45) Date of Patent: Jan. 14, 2025

(54) SEMICONDUCTOR STRUCTURE AND METHOD OF FORMING BURIED FIELD PLATE STRUCTURES

(71) Applicant: Powerchip Semiconductor Manufacturing Corporation, Hsinchu (TW)

(72) Inventors: Chia-Hao Chang, Taipei (TW); Yu-Jen Huang, Hsinchu (TW); Hsin-Hong Chen, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 418 days.

(21) Appl. No.: 17/737,937

(22) Filed: May 5, 2022

(65) Prior Publication Data

US 2023/0282714 A1 Sep. 7, 2023

(30) Foreign Application Priority Data

Mar. 3, 2022 (TW) .................................. 111107706

(51) Int. Cl.
*H01L 29/40* (2006.01)
*H01L 29/66* (2006.01)
*H01L 29/78* (2006.01)

(52) U.S. Cl.
CPC ...... *H01L 29/407* (2013.01); *H01L 29/66734* (2013.01); *H01L 29/7813* (2013.01)

(58) Field of Classification Search
CPC ................ H01L 29/404; H01L 29/407; H01L 29/66734; H01L 29/7813
See application file for complete search history.

(56) References Cited

U.S. PATENT DOCUMENTS

| 8,748,976 B1* | 6/2014 | Kocon ................ H01L 29/7802 |
| | | 257/330 |
| 9,559,198 B2 | 1/2017 | Stefanov et al. |
| 9,786,753 B2* | 10/2017 | Ku ....................... H01L 29/7827 |
| 2003/0047768 A1 | 3/2003 | Disney |
| 2008/0135930 A1 | 6/2008 | Saito |
| 2009/0039419 A1* | 2/2009 | Zundel .................. H01L 29/404 |
| | | 438/270 |
| 2010/0078707 A1* | 4/2010 | Haeberlen ........... H01L 29/7803 |
| | | 438/270 |
| 2010/0308400 A1 | 12/2010 | Darwish et al. |
| 2011/0298043 A1 | 12/2011 | Zeng et al. |

(Continued)

*Primary Examiner* — Evren Seven
(74) *Attorney, Agent, or Firm* — JCIPRNET

(57) ABSTRACT

This disclosure provides a semiconductor structure and a method of forming buried field plate structures. The semiconductor structure includes a substrate, buried field plate structures, and a gate. The substrate incudes a first surface and a second surface opposite the first surface. Each of the buried field plate structures include a conductive structure and an insulation structure surrounding the conductive structure. The gate is embedded in the substrate and extend into the substrate from the first surface of the substrate, wherein the gate is configured between the two neighboring buried field plate structures. The conductive structure includes portions arranging along a direction perpendicular to the first surface of the substrate and having different widths in a direction parallel to the first surface of the substrate.

13 Claims, 7 Drawing Sheets

(56) References Cited

U.S. PATENT DOCUMENTS

| | | | |
|---|---|---|---|
| 2013/0307058 A1* | 11/2013 | Wahl | H01L 29/7397 257/330 |
| 2014/0054682 A1* | 2/2014 | Padmanabhan | H01L 29/407 438/270 |
| 2014/0077290 A1* | 3/2014 | Hsieh | H01L 21/26586 438/270 |
| 2015/0349110 A1* | 12/2015 | Kocon | H01L 29/407 257/334 |
| 2016/0329423 A1* | 11/2016 | Kawahara | H01L 29/513 |
| 2017/0012118 A1* | 1/2017 | Park | H01L 29/086 |
| 2019/0296115 A1* | 9/2019 | Chen | H01L 29/404 |
| 2021/0126124 A1* | 4/2021 | Hsieh | H01L 29/7813 |
| 2022/0262946 A1* | 8/2022 | Blank | H01L 29/407 |
| 2022/0384587 A1* | 12/2022 | Gangi | H01L 29/7813 |

* cited by examiner

SEMICONDUCTOR STRUCTURE AND METHOD OF FORMING BURIED FIELD PLATE STRUCTURES

CROSS-REFERENCE TO RELATED APPLICATION

This application claims the priority benefit of Taiwan application serial no. 111107706, filed on Mar. 3, 2022. The entirety of the above-mentioned patent application is hereby incorporated by reference herein and made a part of this specification.

BACKGROUND OF THE INVENTION

1. Field of the Invention

The invention relates to a semiconductor structure and a method of forming the same, and more particularly, to a semiconductor structure and a method of forming buried field plate structures.

2. Description of Related Art

A dual trench gate power MOSFET is one kinds of mainstream power devices with high frequency and low voltage. However, in the traditional manufacturing process, the thicknesses of insulation structures and the widths of conductive structures in buried field plate structures of the dual trench gate power MOSFET are both formed to be consistent with one another, and thus the thicknesses of the insulation structures near the bottom portions of the buried field plate structures in the trenches are too thin to well control the pinch-off voltages in the bottom portions of the buried field plate structures. As such, the control ability of the pinch-off voltage tends to be limited by the buried field plate structures in the trenches and thus it is hard to improve the breakdown voltage while maintaining a good gate-drain charge (Qgd).

SUMMARY OF THE INVENTION

The present invention provides a semiconductor structure and a method of forming buried field plate structures included in the semiconductor structure in which the conductive structures of the buried field plate structures are designed to have different widths in a direction parallel to the first surface of the substrate to improve the pinch-off voltage and the breakdown voltage.

An embodiment of the present invention provides a semiconductor structure. The semiconductor structure includes a substrate, buried field plate structures, and a gate. The substrate includes a first surface and a second surface opposite to the first surface. The buried field plate structures extend into the substrate from the first surface of the substrate, and each of the buried field plate structures include a conductive structure and an insulation structure surrounding the conductive structure. The gate is embedded in the substrate and extend into the substrate from the first surface of the substrate, wherein the gate is configured between the two neighboring buried field plate structures. The conductive structure includes portions arranging along a first direction perpendicular to the first surface of the substrate and having different widths in a second direction parallel to the first surface of the substrate.

In an embodiment of the present invention, the portions of the conductive structure include a first portion, a second portion, a third portion, and a fourth portion subsequentially arranging in a direction from the second surface of the substrate toward the first surface of the substrate, a width of the second portion is different from a width of the first portion and a width of the third portion, and the width of the third portion is different from a width of the fourth portion.

In an embodiment of the present invention, the insulation structure includes a first layer surrounding the first portion of the conductive structure, a second layer disposed on the first layer and surrounding the second portion of the conductive structure, a third layer disposed on the second layer and surrounding the third portion of the conductive structure, and a fourth layer disposed on the third layer and surrounding the fourth portion of the conductive structure. A second thickness of the second layer is smaller than a first thickness of the first layer and greater than a third thickness of the third layer in the second direction. The third thickness of the third layer is smaller than a fourth thickness of the fourth layer in the second direction.

In an embodiment of the present invention, the second thickness is about 0.4 μm to about 0.6 μm, the third thickness is about 0.2 μm to about 0.4 μm, and the fourth thickness is about 0.3 μm to about 0.6 μm.

In an embodiment of the present invention, the first portion, the second portion, the third portion, and the fourth portion of the conductive structure includes a first depth, a second depth, a third depth, and a fourth depth in the first direction, respectively, and the second depth is smaller than the first depth, the third depth, and the fourth depth.

In an embodiment of the present invention, the first depth is about 1.5 μm to about 2.0 μm, the second depth is about 0.5 μm to about 1.25 μm, the third depth is about 1.5 μm to about 2.0 μm, and the fourth depth is about 1.0 μm to about 1.5 μm.

In an embodiment of the present invention, the substrate includes a drift region, a body region, a first doped region, and a second doped region. The buried field plate structures and the gate are disposed in the drift region. The body region is disposed between the gate and the buried field plate structures. The first doped region is disposed in the body region and has a first conductive type that is identical to the body region. The second doped region is disposed on the body region and between the buried field plate structures and gate. The second doped region has a second conductive type that is different from the first conductive type.

An embodiment of the present invention provides a method of forming buried field plate structures, which includes following steps: forming a first trench in the substrate, wherein the substrate includes a first surface and a second surface opposite to the first surface, and the first trench extends into the substrate from the first surface of the substrate; forming a first insulation layer on sidewalls and a bottom surface of the first trench; forming a first conductive layer in the first trench, wherein the first conductive layer is formed on the first insulation layer and exposes a portion of the first insulation layer; removing the portion of the first insulation layer laterally in a direction parallel to the first surface of the substrate to form a second insulation layer including a second trench, wherein a bottom surface of the second trench exposes a top surface of the first conductive layer; forming a second conductive layer in the second trench that contacts the first conductive layer, wherein the second conductive layer is formed on the first conductive layer and exposes a portion of the second insulation layer; removing the portion of the second insulation layer laterally in the direction parallel to the first surface of the substrate to form a third insulation layer including a third trench, wherein a bottom surface of the third trench exposes a top surface of the second conductive layer; forming a third conductive layer in the third trench that contacts the second conductive layer, wherein the third conductive layer is formed on the second conductive layer and exposes a portion of the third insulation layer; forming an insulation liner on the sidewalls of the third trench that is located above the third conductive layer to form a fourth insulation layer including a fourth trench; and forming a fourth conductive layer in the fourth trench that contacts the third conductive layer.

In an embodiment of the present invention, the fourth insulation layer includes a first portion surrounding the first conductive layer, a second portion disposed on the first portion and surrounding the second conductive layer, a third portion disposed on the second portion and surrounding the third conductive layer, and a fourth portion disposed on the third portion and surrounding the fourth conductive layer. In the direction parallel to the first surface of the substrate, a second thickness of the second portion is smaller than a first thickness of the first portion and greater than a third thickness of the third portion, and the third thickness of the third portion is smaller than a fourth thickness of the fourth portion.

In an embodiment of the present invention, the second thickness is about 0.4 μm to about 0.6 μm, the third thickness is about 0.2 μm to about 0.4 μm, and the fourth thickness is about 0.3 μm to about 0.6 μm.

In an embodiment of the present invention, the first conductive layer, the second conductive layer, the third conductive layer, and the fourth conductive layer include a first depth, a second depth, a third depth, and a fourth depth in a direction perpendicular to the first surface of the substrate, respectively, and the second depth is smaller than the first depth, the third depth, and the fourth depth.

In an embodiment of the present invention, the first depth is about 1.5 μm to about 2.0 μm, the second depth is about 0.5 μm to about 1.25 μm, the third depth is about 1.5 μm to about 2.0 μm, and the fourth depth is about 1.0 μm to about 1.5 μm.

In an embodiment of the present invention, a step of forming the second conductive layer includes: filling a conductive material into the first trench to cover the first insulation layer in the first trench after forming the first insulation layer; and removing a portion of the conductive material in a direction perpendicular to the first surface of the substrate to form the first conductive layer.

In an embodiment of the present invention, a step of forming the second conductive layer includes: filling a conductive material into the second trench to cover sidewalls of the second trench after forming the second insulation layer; and removing a portion of the conductive material in a direction perpendicular to the first surface of the substrate to form the second conductive layer.

In an embodiment of the present invention, a step of forming the third conductive layer includes: filling a conductive material into the third trench to cover sidewalls of the third trench after forming the third insulation layer; and removing a portion of the conductive material in a direction perpendicular to the first surface of the substrate to form the third conductive layer.

In an embodiment of the present invention, a step of forming the fourth insulation layer includes: forming an insulation material layer on a top surface of the third conductive layer and on sidewalls of the third trench over the third conductive layer after forming the third conductive layer; and removing a portion of the insulation material layer located on the top surface of the third conductive layer to form an insulation liner, located above the third conductive layer, on the sidewalls of the third trench.

Based on the above, in the above semiconductor structure and the method of forming the buried field plate structures included in the semiconductor structure, the conductive structures of the buried field plate structures are designed to have different widths in a direction parallel to the first surface of the substrate to improve the pinch-off voltage and the breakdown voltage.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
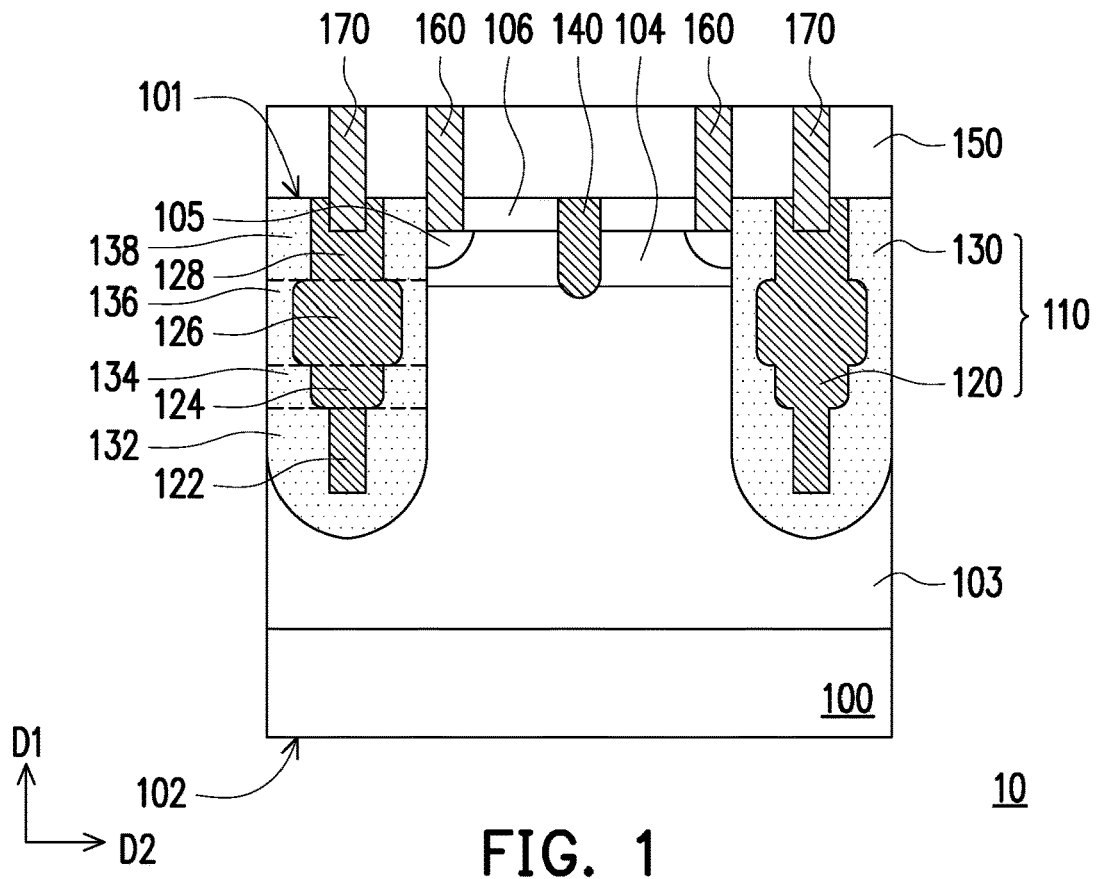
FIG. 1 is a schematic cross-section view illustrating a semiconductor structure in accordance with an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are omitted in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

FIG. 1 is a schematic cross-section view illustrating a semiconductor structure in accordance with an embodiment of the present invention. FIGS. 2A to 2M are schematic cross-section views illustrating a method of forming a buried field plate structure in accordance with an embodiment of the present invention.

Referring to FIG. 1, a semiconductor structure 10 includes a substrate 100, buried field plate structures 110, and a gate 140.

The substrate 100 may include a first surface 101 and a second surface 102 opposite to the first surface 101. The substrate 100 may include a doped semiconductor substrate and an epitaxial layer formed on the doped semiconductor substrate. In some embodiments, the doped semiconductor substrate and the epitaxial layer may have the same conductive type (e.g., N-type). In some embodiments, the doped semiconductor substrate may be a heavily doped N-type (N$^+$) silicon substrate. As such, in the case where the semiconductor structure 10 is a dual trench gate MOS structure, the heavily doped N-type (N$^+$) silicon substrate may be used as a drain electrode of the dual trench gate MOS structure, but the invention is not limited thereto. In some embodiments, the drain electrode (not shown) of the dual trench gate MOS may be disposed on the second surface 102 of the substrate 100. The epitaxial layer may be a lightly doped N-type (N$^-$) epitaxial layer, and a method for forming the lightly doped N-type epitaxial layer may include an epitaxial growth process which is performed on the doped semiconductor substrate.

In some embodiments, the substrate 100 may include a drift region 103, a body region 104, a first doped region 105, and a second doped region 106. The drift region 103 may be a portion of the substrate 100 that includes the lightly doped N-type epitaxial layer. The body region 104 may be disposed in the drift region 103 and may be located between the buried field plate structures 110 and the gate 140 that will be described later. The first doped region 105 may be disposed in the body region 104 and may have the first conductive type that is identical to the body region 104. The second doped region 106 may be disposed on the body region 104 and may be located at position closer to the first surface 101 of the substrate 100 as compared to the first doped region 105. The second doped region 106 may be disposed between the buried field plate structures 110 and the gate 140. The second doped region 106 may have a second conductive type which is different from the first conductive type. In some embodiments, the first conductive type may be P type, whereas the second conductive type may be N type, but the invention is not limited thereto. In some other embodiments, the first conductive type may be N type, whereas the second conductive type may be P type.

The buried field plate structures 110 may extend into the substrate 100 from the first surface 101 of the substrate 100. In some embodiments, the buried field plate structures 110 may be disposed in the drift region 103. Each of the buried field plate structures 110 may include a conductive structure 120 and an insulation structure 130 surrounding the conductive structure 120. The conductive structure 120 may include portions arranging along a direction (e.g., a first direction D1) perpendicular to the first surface 101 of the substrate 100 and having different widths in a direction (e.g., a second direction D2) parallel to the first surface 101 of the substrate 100. The conductive structure 120 may include a conductive material such as a doped polysilicon. The insulation structure 130 may include an insulation material such as an oxide.

In some embodiments, the buried field plate structures 110 may be formed by following steps, for example.

Figure 2A:
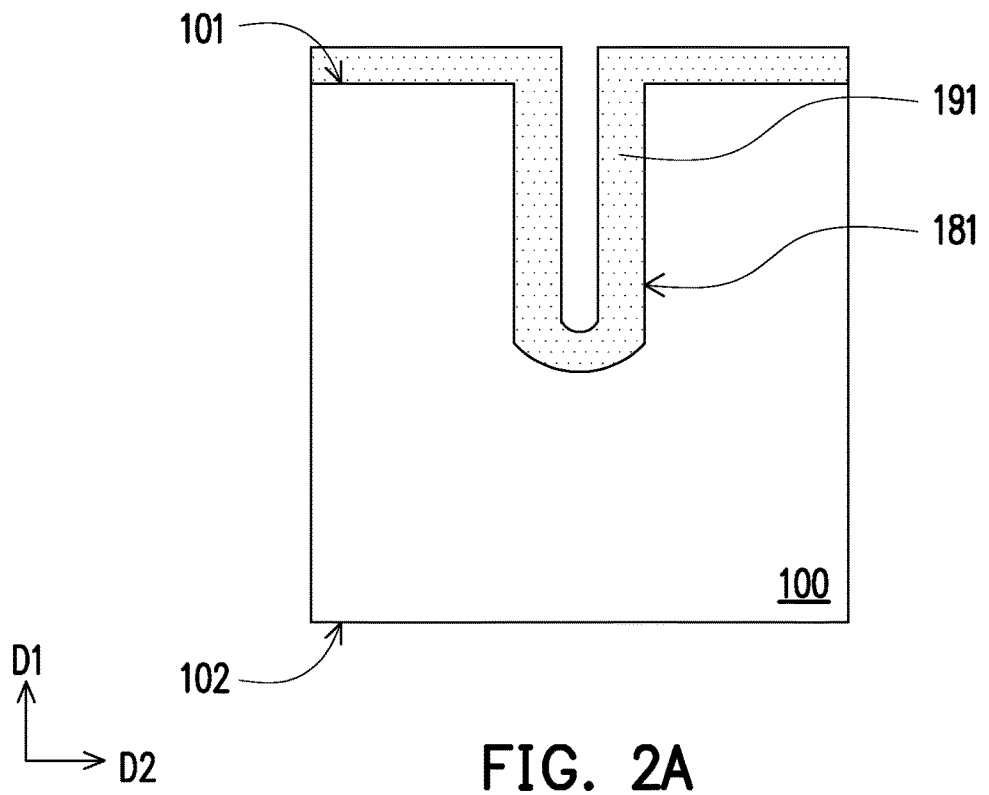
FIGS. 2A to 2M are schematic cross-section views illustrating a method of forming a buried field plate structure in accordance with an embodiment of the present invention.

Firstly, referring to FIG. 2A, a first trench 181 is formed in the substrate 100, wherein the substrate 100 includes the first surface 101 and the second surface 102 opposite to the first surface 101, and the first trench 181 extends into the substrate 100 from the first surface 101 of the substrate 100. Next, a first insulation layer 191 is formed on sidewalls and a bottom surface of the first trench 181. In some embodiments, the first insulation layer 191 may be formed on the first surface 101 of the substrate 100 and may extend into the first trench 181. The material of the first insulation layer 191 may include a silicon oxide. The first insulation layer 191 may be formed on the sidewalls and the bottom surface of the first trench 181 through a deposition process such as a chemical vapor deposition (CVD) process. In some embodiments, as shown in FIG. 2A, the first insulation layer 191 does not fill up the first trench 181, so that a central portion of the first trench 181 is retained.

Figure 2B:
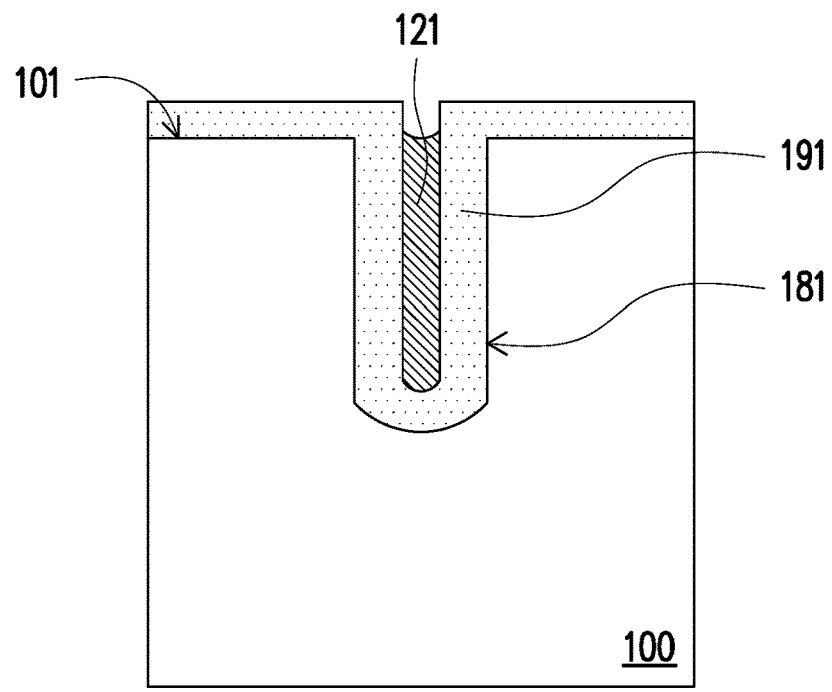

After that, referring to FIG. 2B, a first conductive material 121 fills into the first trench 181 to cover the first insulation layer 191 in the first trench 181. In some embodiments, the first conductive material 121 may be formed by following steps. Firstly, a conductive material (not shown) is formed on the first insulation layer 191. In some embodiments, the conductive material may be formed over the first surface 101 of the substrate 100 and may fill into the first trench 181 (e.g., filling into a central portion of the first trench 181). Then, a portion of the conductive material located above the first surface 101 of the substrate 100 is removed to form the first conductive material 121. In some embodiments, the portion of the conductive material may be removed by using an etch back process. In some embodiments, the first conductive material 121 may fill up the central portion of the first trench 181, but the present invention is not limited thereto. In some embodiments, the first conductive material 121 may include a doped polysilicon.

Figure 2C:
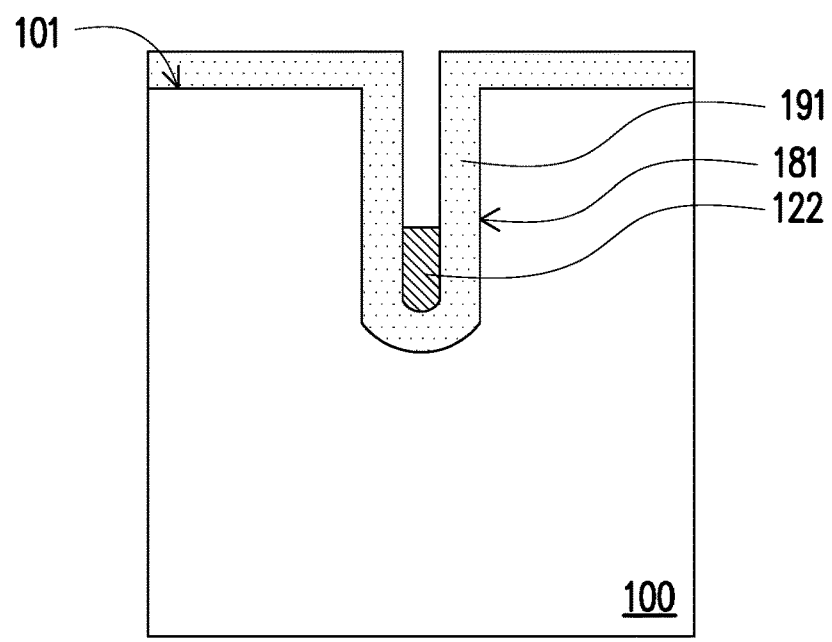

Then, referring to FIG. 2C, a portion of the first conductive material 121 is removed in a direction (e.g., the first direction D1) perpendicular to the first surface 101 of the substrate 100 to form a first conductive layer 122 that exposes a portion of the first insulation layer 191 in the first trench 181. In some embodiments, the portion of the first conductive material 121 is removed by using an anisotropic etching process. In some embodiments, the depth (e.g., a first depth d1 shown in FIG. 2M) of the first conductive layer 122 in the first direction D1 may be about 1.5 μm to about 2.0 μm.

Figure 2D:
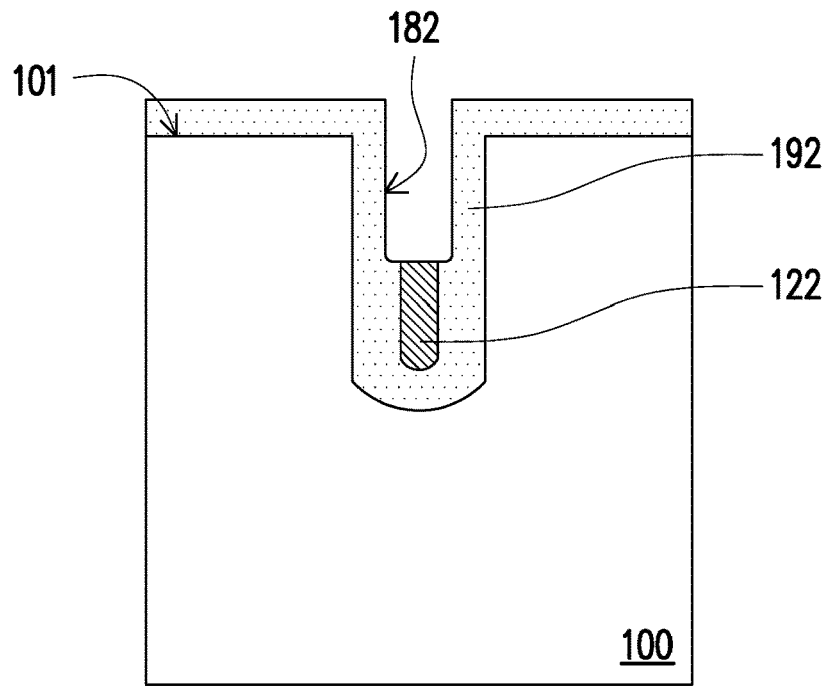

Then, referring to FIG. 2C and FIG. 2D, the portion of the first insulation layer 191 is removed laterally in a direction (e.g., the second direction D2) parallel to the first surface 101 of the substrate 100 to form a second insulation layer 192 including a second trench 182. A bottom surface of the second trench 182 exposes a top surface of the first conductive layer 122. In some embodiments, the portion of the first insulation layer 191 is removed by using an isotropic etching process.

Figure 2E:
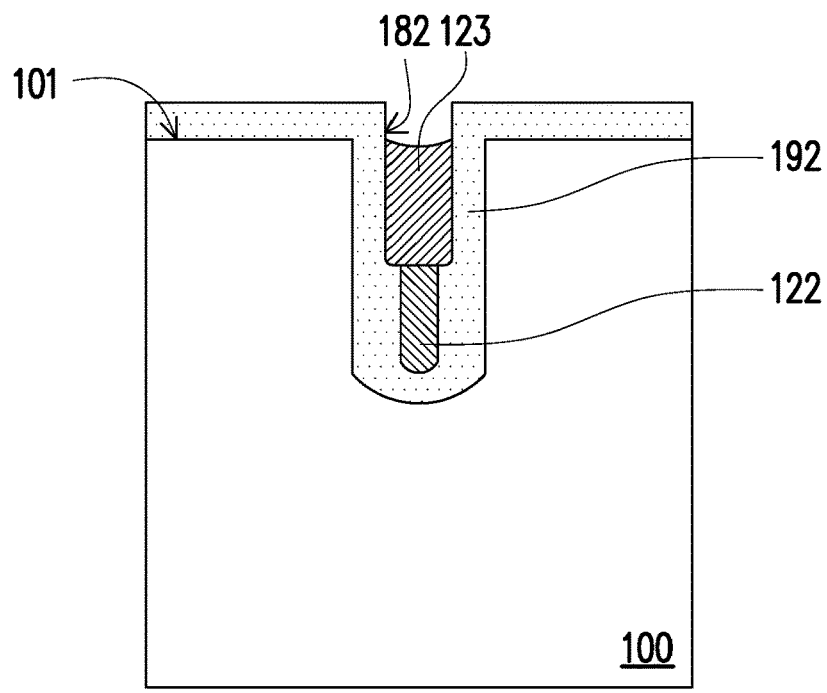

After that, referring to FIG. 2E, a second conductive material 123 fills into the second trench 182 to cover a bottom surface and sidewalls of the second trench 182. In some embodiments, the second conductive material 123 may be formed by following steps. Firstly, a conductive material (not shown) is formed on the second insulation layer 192. In some embodiments, the conductive material may be formed over the first surface 101 of the substrate 100 and may fill into the second trench 182. Then, a portion of the conductive material located above the first surface 101 of the substrate 100 is removed to form the second conductive material 123. In some embodiments, the portion of the conductive material may be removed by using an etch back process. In some embodiments, the second conductive material 123 may fill up a central portion of the second trench 182, but the invention is not limited thereto. In some embodiments, the second conductive material 123 may include a doped polysilicon.

Figure 2F:
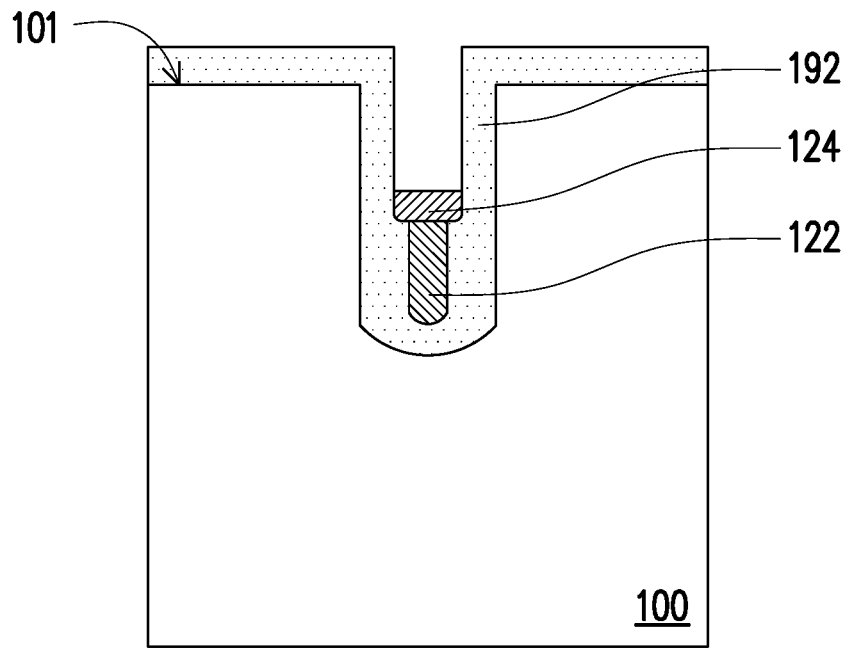

Then, referring to FIG. 2E and FIG. 2F, a portion of the second conductive material 123 is removed in a direction (e.g., the first direction D1) perpendicular to the first surface 101 of the substrate 100 to form a second conductive layer 124 that exposes a portion of the second insulation layer 192. In some embodiments, the portion of the second conductive material 123 may be removed by using an anisotropic etching process. In some embodiments, the depth (e.g., a second depth d2 shown in FIG. 2M) of the second conductive layer 124 in the first direction D1 may be about 0.5 µm to about 1.25 µm.

Figure 2G:
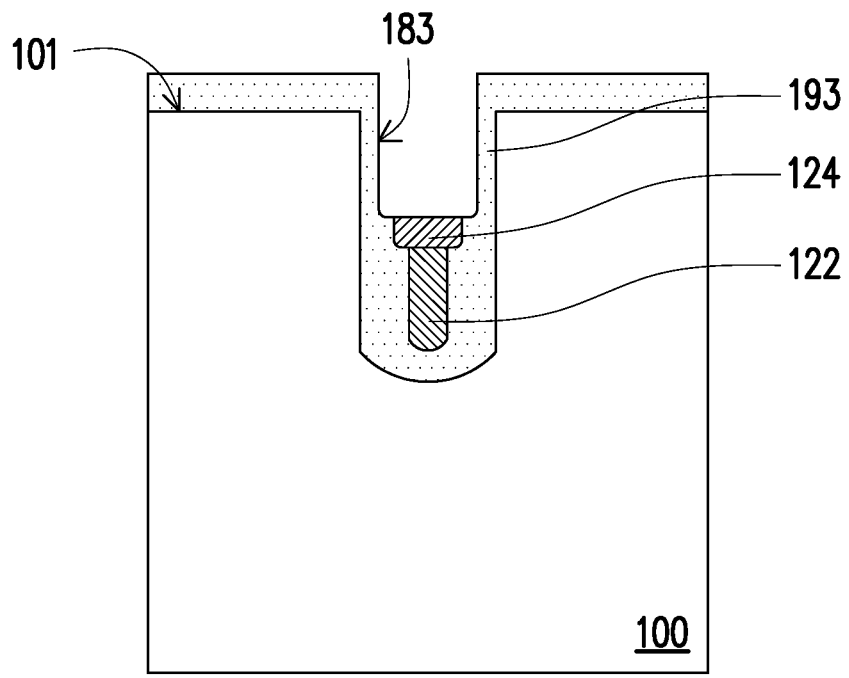

After that, referring to FIG. 2F and FIG. 2G, the portion of the second insulation layer 192 is removed laterally in a direction (e.g., the second direction D2) parallel to the first surface 101 of the substrate 100 to form a third insulation layer 193 including a third trench 183. A bottom surface of the third trench 183 exposes a top surface of the second conductive layer 124. In some embodiments, the portion of the second insulation layer 192 is removed by using an isotropic etching process.

Figure 2H:
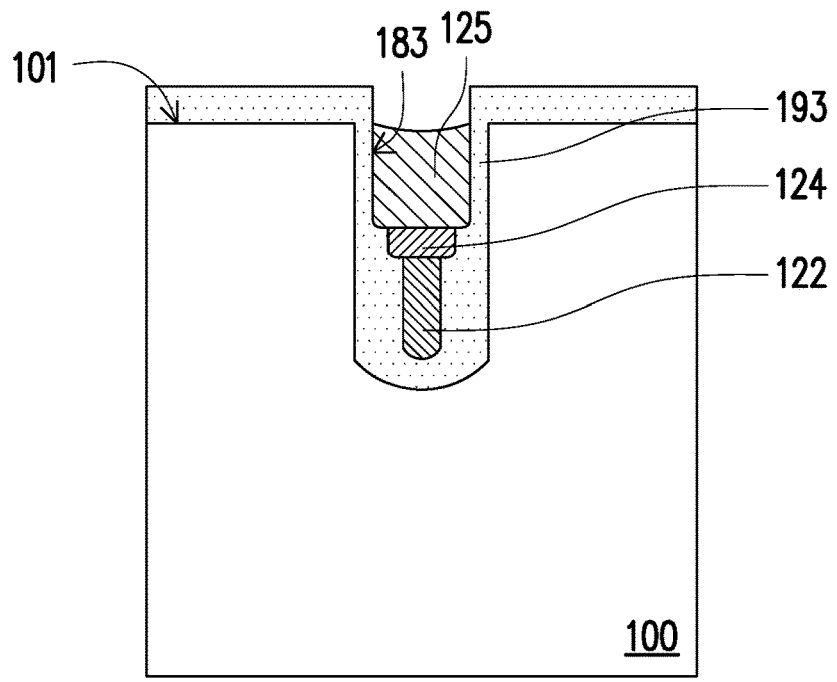

Then, referring to FIG. 2G and FIG. 2H, a third conductive material 125 fills into the third trench 183 to cover a bottom surface and sidewalls of the third trench 183. In some embodiments, the third conductive material 125 may be formed by following steps. Firstly, a conductive material (not shown) is formed on the third insulation layer 193. In some embodiments, the conductive material may be formed over the first surface 101 of the substrate 100 and may fill into the third trench 183. Then, a portion of the conductive material located above the first surface 101 of the substrate 100 is removed to form the third conductive material 125. In some embodiments, the portion of the conductive material may be removed by using an etch back process. In some embodiments, the second conductive material 123 may fill up a central portion of the third trench 183, but the invention is not limited thereto. In some embodiments, the third conductive material 125 may include a doped polysilicon.

Figure 2I:
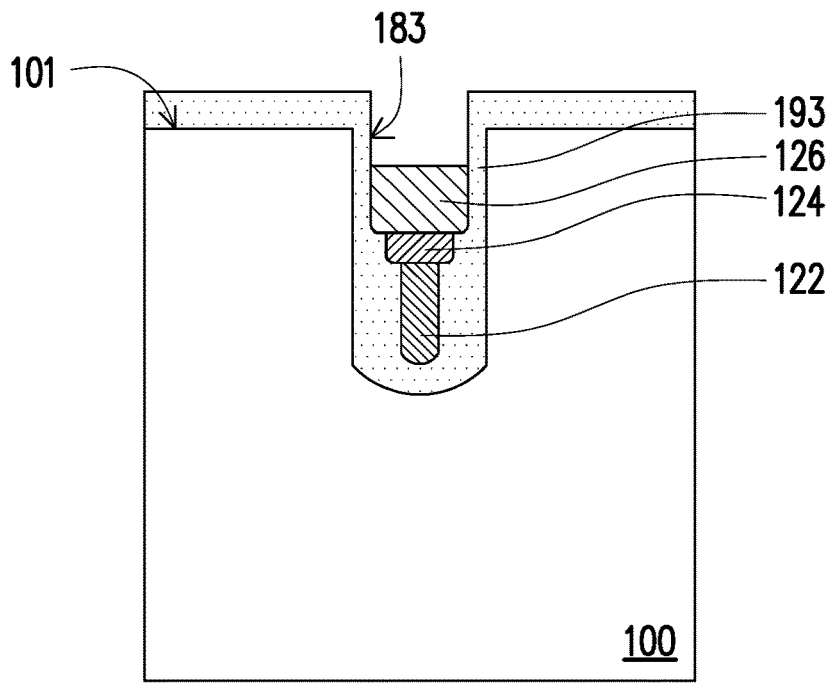

After that, referring to FIG. 2I, a portion of the third conductive material 125 is removed in a direction (e.g., the first direction D1) perpendicular to the first surface 101 of the substrate 100 to form a third conductive layer 126 that exposes a portion of the third insulation layer 193. In some embodiments, the portion of the third conductive material 125 is removed by using an anisotropic etching process. In some embodiments, the depth (e.g., a third depth d3 shown in FIG. 2M) of the third conductive layer 126 in the first direction D1 may be about 1.5 µm to about 2.0 µm.

Figure 2J:
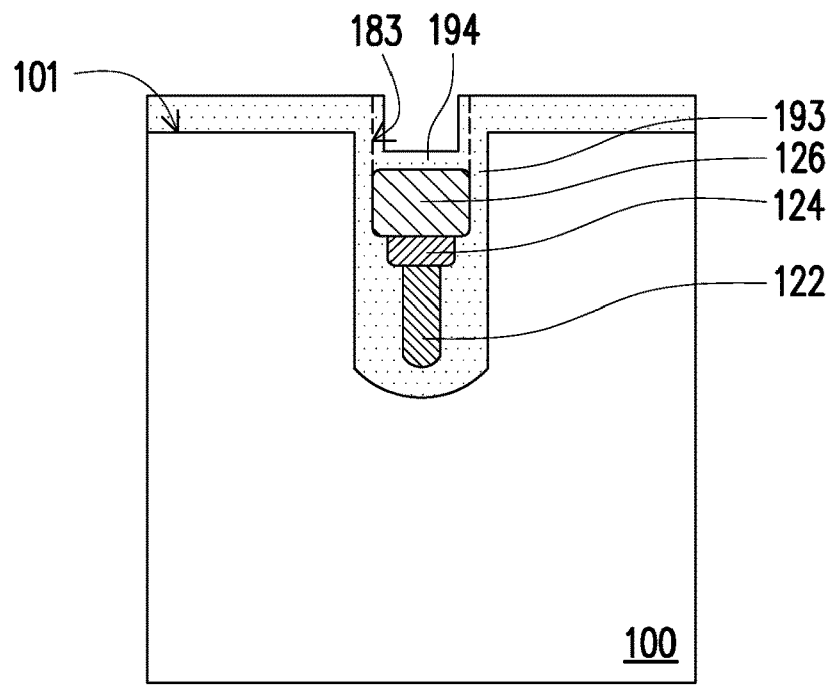

Then, referring to FIG. 2I and FIG. 2J, an insulation liner 194 is formed on sidewalls of the third trench 183 and a top surface of the third conductive layer 126. In some embodiments, the insulation liner 194 may be formed by using a thermal oxidation process. In this embodiment, since the third conductive layer 126 is formed of a material including a polysilicon, a portion of the third conductive layer 126 near the top surface will be converted to a silicon oxide in the case where the thermal oxidation process is applied for forming the insulation liner 194. As such, the insulation liner 194 will be formed on the top surface of the third conductive layer 126. In this embodiment, as shown in FIG. 2J, the third conductive layer 126 may have round corners where the top surface of the third conductive layer 126 meets the sidewalls of the third trench 183. The material of the insulation liner 194 may include a silicon oxide.

Figure 2K:
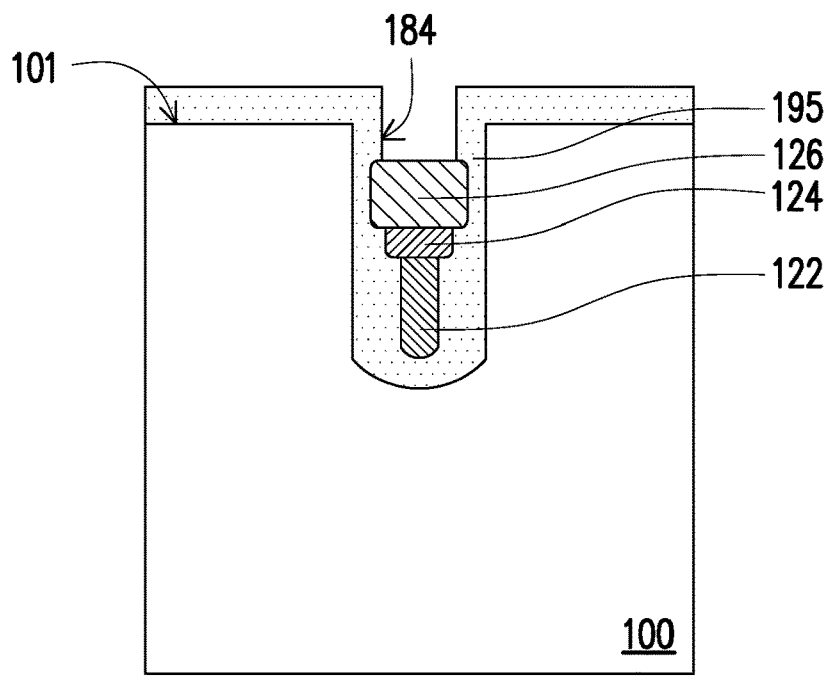

After that, referring to FIG. 2J and FIG. 2K, a portion of the insulation liner 194 that forms on the top surface of the third conductive layer 126 is removed to form a fourth insulation material layer 195 including a fourth trench 184. A bottom surface of the fourth trench 184 exposes the top surface of the third conductive layer 126. In some embodiments, the portion of the insulation liner 194 may be removed by using an anisotropic etching process.

Figure 2L:
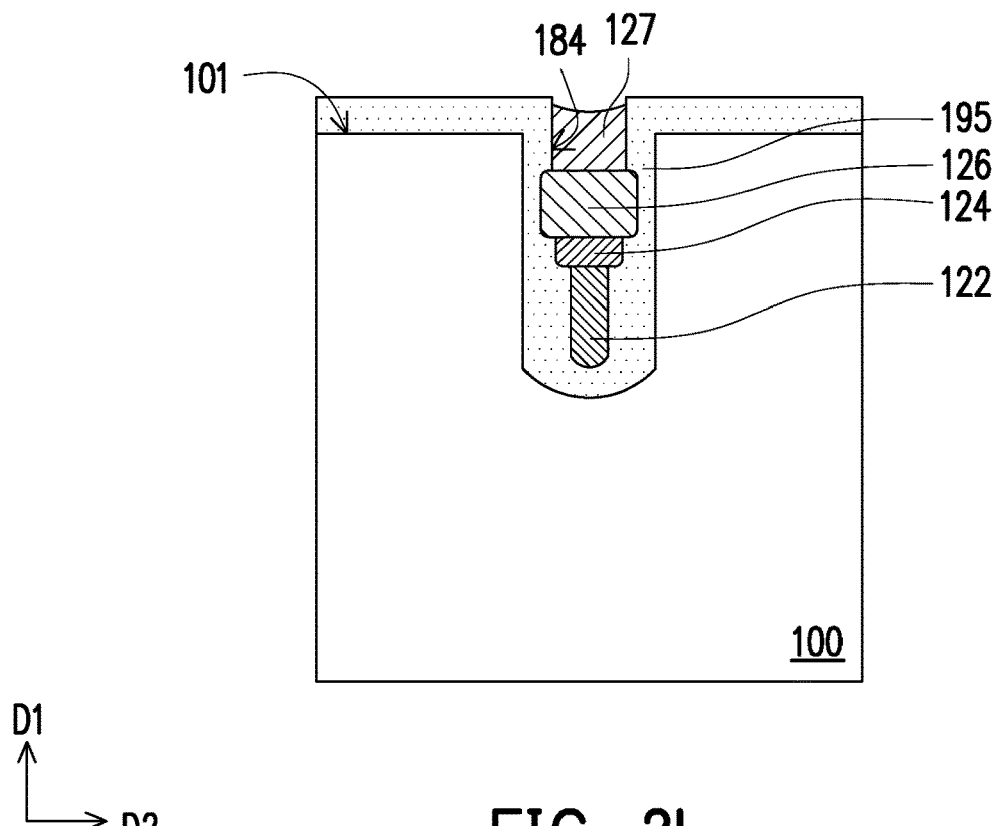

Then, referring to FIG. 2L, a fourth conductive material 127 fills in the fourth trench 184 to cover a bottom surface and sidewalls of the fourth trench 184. In some embodiments, the fourth conductive material 127 may be formed by following steps. Firstly, a conductive material (not shown) is formed on the fourth insulation material layer 195. In some embodiments, the conductive material may be formed over the first surface 101 of the substrate 100 and may fill into the fourth trench 184. Then, a portion of the conductive material located above the first surface 101 of the substrate 100 is removed to form the fourth conductive material 127. In some embodiments, the portion of the conductive material is removed by using an etch back process. In some embodiments, the fourth conductive material 127 fills up the central portion of the fourth trench 184, but the invention is not limited thereto. In some embodiments, the fourth conductive material 127 may include a doped polysilicon.

Figure 2M:
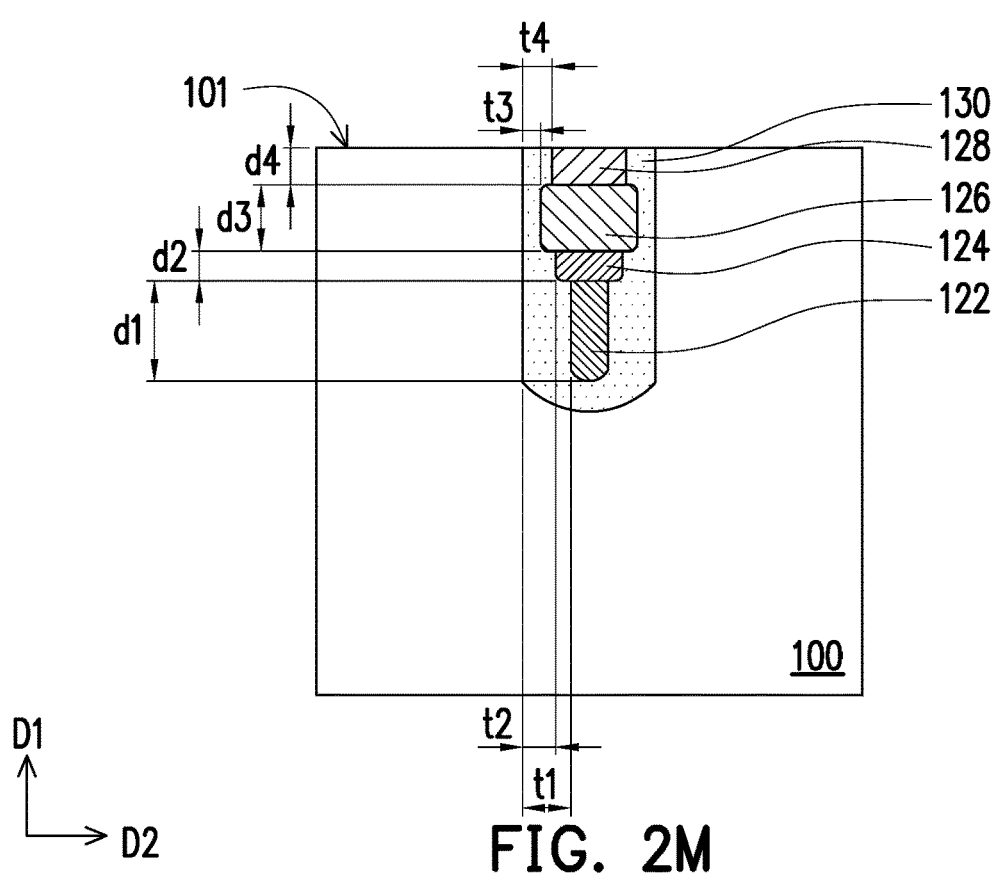

After that, referring to FIG. 2L and FIG. 2M, a portion of the fourth insulation material layer 195 and a portion of the fourth conductive material 127 that are both located above the first surface 101 of the substrate 100 are removed to form a fourth conductive layer 128 and a fourth insulation layer 130. In some embodiments, the portion of the fourth insulation material layer 195 and the portion of the fourth conductive material 127 may be removed by using a planarization process such as a chemical mechanical polishing (CMP) process, such that the top surface of the fourth insulation layer 130 and the top surface of the fourth conductive layer 128 may be coplanar. In some embodiments, the depth (e.g., a fourth depth d4 shown in FIG. 2M) of the fourth conductive layer 128 in the first direction may be about 1.0 µm to about 1.5 µm.

Based on the above, as shown in FIG. 1 or FIG. 2M, the conductive structure 120 in the buried field plate structure 110 are formed to include portions having different widths in a direction parallel to the first surface 101 of the substrate 100 to improve the pinch-off voltage and the breakdown voltage.

In some embodiments, the first conductive layer 122, the second conductive layer 124, the third conductive layer 126, and the fourth conductive layer 128 may be formed of the same material (e.g., a doped polysilicon), that is, there are no interfaces where different materials being in contact with each other between the first conductive layer 122, the second conductive layer 124, the third conductive layer 126, and the fourth conductive layer 128.

In some embodiments, as shown in FIG. 1, the fourth insulation layer 130 may include a first portion 132, a second portion 134, a third portion 136, and a fourth portion 138. The first portion 132 may surround the first conductive layer 122. The second portion 134 may be disposed on the first portion 132 and may surround the second conductive layer 124. The third portion 136 may be disposed on the second portion 134 and may surround the third conductive layer 126. The fourth portion 138 may be disposed on the third portion 136 and may surround the fourth conductive layer 128. In a direction parallel to the first surface 101 of the substrate 100, a second thickness (e.g., t2 shown in FIG. 2M) of the second portion 134 may be smaller than a first thickness (e.g., t1 shown in FIG. 2M) of the first portion 132 and greater than a third thickness (e.g., t3 shown in FIG. 2M) of the third portion 136. The third thickness of the third portion 136 may be smaller than a fourth thickness (e.g., t4 shown in FIG. 2M) of the fourth portion 138.

In some embodiments, the second thickness t2 may be about 0.4 μm to about 0.6 μm. In some embodiments, the third thickness t3 may be about 0.2 μm to about 0.4 μm. In some embodiments, the fourth thickness t4 may be about 0.3 μm to about 0.6 μm. In the case where the second thickness t2, the third thickness t3, and the fourth thickness t4 are within the foregoing ranges, the break down voltage of the buried field plate structure 110 may be enhanced.

Please continue to refer to FIG. 1. The gate 140 extends into the substrate 100 from the first surface 101 of the substrate 100 and is configured between the two neighboring buried field plate structures 110. In some embodiments, the gate 140 may be disposed in the drift region 103. In some embodiments, the gate 140 may include an insulation layer (e.g., oxide) and a conductive layer (e.g., a doped polysilicon). In some embodiments, the conductive layer of the gate 140 may be spaced apart from the substrate 100 by the insulation layer disposed between the conductive layer and the substrate 100. In some embodiments, the conductive layer of the gate 140 and the conductive structure 120 of the buried field plate structure 110 may be formed of the same material, but the invention is not limited thereto.

In some embodiments, the semiconductor structure 10 may include a dielectric layer 150, first contacts 160, and second contacts 170. The dielectric layer 150 may be disposed on the substrate 100. The first contacts 160 penetrate through the dielectric layer 150 and extend into the substrate 100 from the first surface 101 of the substrate 100 toward the second surface 102 of the substrate 100 to connect the first doped region 105 of the substrate 100. The second contacts 170 penetrate through the dielectric layer 150 and connect the conductive structures 120 of the buried field plate structures 110. The material of the dielectric layer 150 may include a silicon oxide, a silicon nitride, and a silicon oxynitride, but the invention is not limited thereto. The first contacts 160 and the second contacts 170 may include conductive materials such as metals (e.g., Al or W), metal nitrides (e.g., WN, TiSiN, WSiN, TiN, or TaN), or combinations thereof.

In some embodiments, the semiconductor structure 10 may further include a gate pad and a gate wire (not shown). The gate pad may be disposed on the dielectric layer 150. The gate wire may be disposed in the dielectric layer 150 and may electrically connect the gate 140 to the gate pad. The materials of the gate pad and the gate wire may include conductive materials such as metals (e.g., Al or W), conductive metal nitrides (e.g., WN, TiSiN, WSiN, TiN, or TaN), or combinations thereof.

In some embodiments, the semiconductor structure 10 may further include a source pad (not shown) disposed above the dielectric layer 150. In some embodiments, the first contacts 160 and/or the second contacts 170 may be electrically connected to the source pad. The material of the source pad may include a conductive material such as a metal (e.g., Al or W), a conductive metal nitride (e.g., WN, TiSiN, WSiN, TiN, or TaN), or a combination thereof.

Based on the above, in the above semiconductor structure and the method of forming the buried field plate structures included in the semiconductor structure, the conductive structures of the buried field plate structures are designed to have different widths in a direction parallel to the first surface of the substrate to improve the pinch-off voltage and the breakdown voltage.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
 a substrate comprising a first surface and a second surface opposite to the first surface;
 buried field plate structures extending from the first surface of the substrate into the substrate, wherein each of the buried field plate structures comprises a conductive structure and an insulation structure surrounding the conductive structure; and
 a gate embedded in the substrate, wherein the gate extends into the substrate from the first surface of the substrate and is configured between two neighboring buried field plate structures,
 wherein the conductive structure comprises portions arranging along a first direction perpendicular to the first surface of the substrate and having different widths in a second direction parallel to the first surface of the substrate,
 wherein the portions of the conductive structure comprise a first portion, a second portion, a third portion, and a fourth portion subsequentially arranging in a direction from the second surface of the substrate toward the first surface of the substrate, a width of the second portion is different from a width of the first portion and a width of the third portion, and the width of the third portion is different from a width of the fourth portion, and
 wherein the insulation structure comprises:
  a first layer surrounding the first portion of the conductive structure;
  a second layer disposed on the first layer and surrounding the second portion of the conductive structure;
  a third layer disposed on the second layer and surrounding the third portion of the conductive structure; and
  a fourth layer disposed on the third layer and surrounding the fourth portion of the conductive structure, and
 wherein a second thickness of the second layer is smaller than a first thickness of the first layer and greater than a third thickness of the third layer in the second direction, and the third thickness of the third layer is smaller than a fourth thickness of the fourth layer in the second direction.

2. The semiconductor structure of claim 1, wherein the second thickness is about 0.4 μm to about 0.6 μm, the third thickness is about 0.2 μm to about 0.4 μm, and the fourth thickness is about 0.3 μm to about 0.6 μm.

3. The semiconductor structure of claim 1, wherein the first portion, the second portion, the third portion, and the fourth portion of the conductive structure comprise a first depth, a second depth, a third depth, and a fourth depth in the first direction, respectively, and the second depth is smaller than the first depth, the third depth, and the fourth depth.

4. The semiconductor structure of claim 3, wherein the first depth is about 1.5 µm to about 2.0 µm, the second depth is about 0.5 µm to about 1.25 µm, the third depth is about 1.5 µm to about 2.0 µm, and the fourth depth is about 1.0 µm to about 1.5 µm.

5. The semiconductor structure of claim 1, wherein the substrate comprises a drift region, a body region, a first doped region, and a second doped region, and
the buried field plate structures and the gate are disposed in the drift region,
the body region is disposed between the gate and the buried field plate structures,
the first doped region is disposed in the body region and has a first conductive type that is identical to the body region,
the second doped region is disposed on the body region and between the buried field plate structures and the gate, and the second doped region has a second conductive type that is different from the first conductive type.

6. A method of forming a buried field plate structure, comprising:
forming a first trench in the substrate, wherein the substrate comprises a first surface and a second surface opposite to the first surface, and the first trench extends into the substrate from the first surface of the substrate;
forming a first insulation layer on sidewalls and a bottom surface of the first trench;
forming a first conductive layer in the first trench, wherein the first conductive layer is formed on the first insulation layer and exposes a portion of the first insulation layer;
removing the portion of the first insulation layer laterally in a direction parallel to the first surface of the substrate to form a second insulation layer comprising a second trench, wherein a bottom surface of the second trench exposes a top surface of the first conductive layer;
forming a second conductive layer in the second trench that contacts the first conductive layer, wherein the second conductive layer is formed on the first conductive layer and exposes a portion of the second insulation layer;
removing the portion of the second insulation layer laterally in the direction parallel to the first surface of the substrate to form a third insulation layer comprising a third trench, wherein a bottom surface of the third trench exposes a top surface of the second conductive layer;
forming a third conductive layer in the third trench that contacts the second conductive layer, wherein the third conductive layer is formed on the second conductive layer and exposes a portion of the third insulation layer;
forming an insulation liner on the sidewalls of the third trench that is located above the third conductive layer to form a fourth insulation layer comprising a fourth trench; and
forming a fourth conductive layer in the fourth trench that contacts the third conductive layer,
wherein the fourth insulation layer comprises:
a first portion surrounding the first conductive layer;
a second portion disposed on the first portion and surrounding the second conductive layer;
a third portion disposed on the second portion and surrounding the third conductive layer; and
a fourth portion disposed on the third portion and surrounding the fourth conductive layer, and
wherein in the direction parallel to the first surface of the substrate, a second thickness of the second portion is smaller than a first thickness of the first portion and greater than a third thickness of the third portion, and the third thickness of the third portion is smaller than a fourth thickness of the fourth portion.

7. The method of claim 6, wherein the second thickness is about 0.4 µm to about 0.6 µm, the third thickness is about 0.2 µm to about 0.4 µm, and the fourth thickness is about 0.3 µm to about 0.6 µm.

8. The method of claim 6, wherein the first conductive layer, the second conductive layer, the third conductive layer, and the fourth conductive layer comprise a first depth, a second depth, a third depth, and a fourth depth in a direction perpendicular to the first surface of the substrate, respectively, and the second depth is smaller than the first depth, the third depth, and the fourth depth.

9. The method of claim 8, wherein the first depth is about 1.5 µm to about 2.0 µm, the second depth is about 0.5 µm to about 1.25 µm, the third depth is about 1.5 µm to about 2.0 µm, and the fourth depth is about 1.0 µm to about 1.5 µm.

10. The method of claim 6, wherein a step of forming the first conductive layer comprises:
filling a conductive material into the first trench to cover the first insulation layer in the first trench after forming the first insulation layer; and
removing a portion of the conductive material in a direction perpendicular to the first surface of the substrate to form the first conductive layer.

11. The method of claim 6, wherein a step of forming the second conductive layer comprises:
filling a conductive material into the second trench to cover sidewalls of the second trench after forming the second insulation layer; and
removing a portion of the conductive material in a direction perpendicular to the first surface of the substrate to form the second conductive layer.

12. The method of claim 6, wherein a step of forming the third conductive layer comprises:
filling a conductive material into the third trench to cover sidewalls of the third trench after forming the third insulation layer; and
removing a portion of the conductive material in a direction perpendicular to the first surface of the substrate to form the third conductive layer.

13. The method of claim 6, wherein a step of forming the fourth insulation layer comprises:
forming an insulation material layer on a top surface of the third conductive layer and on sidewalls of the third trench over the third conductive layer after forming the third conductive layer; and
removing a portion of the insulation material layer located on the top surface of the third conductive layer to form an insulation liner, located above the third conductive layer, on the sidewalls of the third trench.

* * * * *